(12) United States Patent
Takagimoto

(10) Patent No.: US 9,986,611 B2
(45) Date of Patent: May 29, 2018

(54) LIGHT-EMITTING ELEMENT DRIVING DEVICE, LIGHT-EMITTING DEVICE, AND VEHICLE

(71) Applicant: Rohm Co., Ltd., Kyoto (JP)

(72) Inventor: Shinsuke Takagimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days. days.

(21) Appl. No.: 15/512,341

(22) PCT Filed: Sep. 3, 2015

(86) PCT No.: PCT/JP2015/075025
§ 371 (c)(1),
(2) Date: Mar. 17, 2017

(87) PCT Pub. No.: WO2016/052065
PCT Pub. Date: Apr. 7, 2016

(65) Prior Publication Data
US 2017/0290118 A1    Oct. 5, 2017

(30) Foreign Application Priority Data
Oct. 2, 2014    (JP) ................... 2014-204261

(51) Int. Cl.
*B60Q 1/14*    (2006.01)
*H05B 37/02*    (2006.01)
(Continued)

(52) U.S. Cl.
CPC ....... *H05B 33/0845* (2013.01); *B60Q 1/1415* (2013.01); *H05B 33/0815* (2013.01);
(Continued)

(58) Field of Classification Search
CPC ............ H05B 33/0815; H05B 33/0845; B60Q 11/002; B60Q 11/005; B60Q 2300/146
(Continued)

(56) References Cited

U.S. PATENT DOCUMENTS 8,461,777 B1 *   6/2013   Mednik .............. H05B 33/0893
                                                             315/185 R
2002/0140380 A1*  10/2002  Biebl ................. H05B 33/0815
                                                             315/291
(Continued)

FOREIGN PATENT DOCUMENTS

JP    2007-218196    8/2007
JP    2010-15887     1/2010
(Continued)

OTHER PUBLICATIONS

Japanese Patent Office, International Search Report for International Patent Application No. PCT/JP2015/075025 dated Dec. 8, 2015 with English translation.

*Primary Examiner* — Tung X Le
(74) *Attorney, Agent, or Firm* — Fish & Richardson P.C.

(57) ABSTRACT

A light emitting drive device has an output voltage supply unit, and an emergency drive unit. The output voltage supply unit generates an output voltage from an input voltage on the basis of a control signal transmitted from a control unit, and supplies at least one light emitting element with the output voltage. In the cases where the emergency drive unit received a signal indicating abnormality of the control unit, the emergency drive unit lights the whole or a part of the at least one light emitting element irrespective of the control signal transmitted from the control unit.

12 Claims, 14 Drawing Sheets

(51) Int. Cl.
  *H05B 33/08* (2006.01)
  *B60Q 1/04* (2006.01)
  *B60Q 1/44* (2006.01)
  *B60Q 1/34* (2006.01)
  *B60Q 1/30* (2006.01)

(52) U.S. Cl.
  CPC .......... *H05B 33/0884* (2013.01); *B60Q 1/04* (2013.01); *B60Q 1/30* (2013.01); *B60Q 1/34* (2013.01); *B60Q 1/44* (2013.01); *B60Q 2400/30* (2013.01)

(58) Field of Classification Search
  USPC ............................................. 315/77, 82, 307
  See application file for complete search history.

(56) References Cited

U.S. PATENT DOCUMENTS

| | | | |
|---|---|---|---|
| 2012/0181931 A1* | 7/2012 | Katsura | B60Q 11/005 315/82 |
| 2012/0313545 A1* | 12/2012 | Courtel | H05B 33/0815 315/250 |
| 2013/0062936 A1 | 3/2013 | Aragai | |
| 2014/0097755 A1* | 4/2014 | Lee | H05B 33/083 315/122 |
| 2015/0340950 A1* | 11/2015 | Wibben | H05B 33/0845 323/288 |
| 2016/0081148 A1* | 3/2016 | Liang | H05B 33/089 324/414 |

FOREIGN PATENT DOCUMENTS

| | | |
|---|---|---|
| JP | 2013-60085 | 4/2013 |
| JP | 2013-217213 | 10/2013 |
| JP | 2014-138524 | 7/2014 |
| WO | 2014-017465 | 1/2014 |

\* cited by examiner

LIGHT-EMITTING ELEMENT DRIVING DEVICE, LIGHT-EMITTING DEVICE, AND VEHICLE

TECHNICAL FIELD

The present invention relates to a light-emitting element driving device for driving a light-emitting element, and to a light-emitting device and a vehicle that employ a light-emitting element driving device.

BACKGROUND ART

FIG. 16 is a diagram showing one example of a light-emitting device. The light-emitting device of this example includes at least one light-emitting element (in FIG. 16, light-emitting diodes) Z1, a light-emitting element driver IC (integrated circuit) 100 which drives the light-emitting element Z1, a P-channel MOS (metal-oxide-semiconductor) transistor P1 which is inserted in the power feed path from the light-emitting element driver IC 100 to the light-emitting element Z1, a controller IC 200 which feeds the light-emitting element driver IC 100 with a PWM (pulse-width modulation) dimming signal S1, and a monitor IC 300 which checks for a fault in the controller IC 200.

The light-emitting element driver IC 100 is a semiconductor integrated circuit device that has integrated into it an output voltage generator 101, which generates a constant output voltage Vo from an input voltage Vi to feed the output voltage Vo to the light-emitting element Z1, and an output current controller 102, which turns the transistor P1 ON and OFF according to the PWM dimming signal S1 output from the controller IC 200 to control the duty of an output current Io through the light-emitting element Z1 (thereby to control the luminance of the light-emitting element Z1). To increase the luminance of the light-emitting element Z1, the ON duty of the PWM dimming signal S1 (the proportion of the ON period Ton in the period T shown in FIG. 17) is set at a larger value; reversely, to decrease the luminance of the light-emitting element Z1, the ON duty of the PWM dimming signal S1 is set at a smaller value. The light-emitting element driver IC 100 also has external terminals T11 to T14. To the external terminal T11, the input voltage Vi is applied. From the external terminal T12, the output voltage Vo is output. To the external terminal T13, the PWM dimming signal S1 is fed. From the external terminal T14, a gate control signal for turning the transistor P1 ON and OFF is output.

The controller IC 200 is a semiconductor integrated circuit device that has integrated into it a clock circuit 201, which generates a clock signal S2, and a PWM circuit 202, which generates the PWM dimming signal S1 based on the clock signal S2. The controller IC 200 also has external terminals T21 to T23. From the external terminal T21, the PWM dimming signal S1 is output. From the external terminal T22, the clock signal S2 is output. To the external terminal T23, the monitoring result signal S3 is fed. There is no particular restriction on how the controller IC 200 uses the monitoring result signal S3; for example, in one conceivable configuration, when the monitoring result signal S3 is in a state that indicates a fault in the controller IC 200, the operation of the controller IC 200 can be stopped completely for increased safety.

The monitor IC 300 has external terminals T31 and T32. Based on the clock signal S2 fed to the external terminal T31, the monitor IC 300 checks whether or not the controller IC 200 is faulty to output the check result, as the monitoring result signal S3, from the external terminal T32. In this example, when the controller IC 200 is not faulty, the monitoring result signal S3 is at HIGH level, and when the controller IC 200 is faulty, the monitoring result signal S3 is at LOW level. That is, a LOW-level monitoring result signal S3 serves as a signal that indicates a fault in the controller IC 200.

Although in FIG. 16 the monitoring result signal S3 is fed only to the controller IC 200, this is not meant as any limitation; for example, instead of the controller IC 200, or in addition to the controller IC 200, a controller that controls the entire appliance that incorporates the light-emitting device shown in FIG. 16 may be fed with the monitoring result signal S3. Although in FIG. 16 the monitor IC 300 checks for only a fault in the controller IC 200, a configuration is also possible where the controller IC 200 and the monitor IC 300 each check for a fault in the other.

LIST OF CITATIONS

Patent Literature

Patent Document 1: Japanese Patent Application published as No. 2013-217213
Patent Document 2: Japanese Patent Application published as No. 2007-218196

SUMMARY OF THE INVENTION

Technical Problem

One conceivable application of the light-emitting device shown in FIG. 16 is in lights mounted on vehicles.

It is preferable that vehicles be furnished with a limp-home capability that enables them to move over a short distance to a safe place in case a failure prevents them from travelling normally. For example, Patent Document 1 discloses a limp-home capability related to a common-rail fuel injection control device in vehicles, and Patent Document 2 discloses a limp-home capability related to a DPF (diesel particulate filter) in vehicles.

Inconveniently, however, the light-emitting device shown in FIG. 16 has the following drawback. When a fault in the controller IC 200 causes the clock signal S2 to cease to be generated (after time point t1 in FIG. 17), no pulses appear in the PWM dimming signal S1 any longer (see broken lines in the PWM dimming signal S1 shown in FIG. 17); this makes the ON duty of the PWM dimming signal S1 zero, and makes the output current Io zero. This means that it is impossible to furnish lights for vehicles that incorporate the light-emitting device shown in FIG. 16 with a limp-home capability for night travel and the like.

Against the background discussed above, an object of the present invention is to provide a light-emitting element driving device that operates based on a control signal from a controller so long as the controller is operating normally but that turns ON a light-emitting element irrespective of the control signal from the controller when the controller is operating abnormally, and another object of the present invention is to provide a light-emitting device and a vehicle that employ such a light-emitting element driving device.

Means for Solving the Problem

To achieve the above objects, according to one aspect of the present invention, a light-emitting element driving device includes: an output voltage feeder configured to generate an output voltage from an input voltage based on a control signal from a controller to feed the output voltage to at least one light-emitting element; and an emergency driver configured to turn ON all or part of the at least one light-emitting element irrespective of the control signal from the controller on receiving a signal indicating a fault in the controller. (A first configuration.)

In the light-emitting element driving device of the first configuration described above, preferably, the value of the current that the emergency driver outputs to all or the part of the at least one light-emitting element is smaller than the value of the current that the output voltage feeder outputs to the at least one light-emitting element. (A second configuration.)

In the light-emitting element driving device of the first or second configuration described above, preferably, the output voltage feeder and the emergency driver share the following circuit blocks between them: a high-side transistor and a low-side transistor connected between a terminal to which the input voltage is applied and a ground terminal, the connection node between the high-side and low-side transistors being connected via a coil to an output capacitor; a high-side driver and a low-side driver configured to generate drive control signals for the high-side and low-side transistors respectively; an amplifier configured to generate a feedback voltage commensurate with the current through the at least one light-emitting element; and a driver controller configured to drive the high-side and low-side drivers so as to turn the high-side and low-side transistors ON and OFF according to the feedback voltage. Here, the high-side and low-side transistors, the high-side and low-side drivers, the amplifier, and the driver controller are all integrated in a single semiconductor device. (A third configuration.)

In the light-emitting element driving device of the third configuration described above, preferably, the emergency driver includes a selector configured to select and output the control signal when no signal indicating a fault in the controller is received and to select and output a constant voltage when a signal indicating a fault in the controller is received. Here, the driver controller is configured to switch whether or not to drive the high-side and low-side drivers according to the output of the selector. (A fourth configuration.)

In the light-emitting element driving device of the fourth configuration described above, preferably, the selector is integrated in the single semiconductor device. (A fifth configuration.)

According to another aspect of the present invention, a light-emitting device includes: a light-emitting element driving device of any one of the first to fifth configurations described above; at least one light-emitting element configured to be driven by the light-emitting element driving device; a controller configured to feed a control signal to the light-emitting element driving device; and a monitor configured to monitor the controller to transmit, on detecting a fault in the controller, a signal indicating the fault in the controller to the light-emitting element driving device. (A sixth configuration.)

In the light-emitting device of the sixth configuration described above, preferably, the light-emitting element is a light-emitting diode or an organic EL element. (A seventh configuration.)

In the light-emitting device of the seventh configuration described above, preferably, the light-emitting device is used as a vehicle-mounted lamp. (An eighth configuration.)

In the light-emitting device of the eighth configuration described above, preferably, the light-emitting device is mounted as a head light module, a turn lamp module, or a rear lamp module on a vehicle. (A ninth configuration.)

According to yet another aspect of the present invention, a vehicle includes a light-emitting device of the eighth or ninth configuration described above. (A tenth configuration.)

In the vehicle of the tenth configuration described above, preferably, the light-emitting device is used as one of a head light, a light source for daytime running light, a tail lamp, a stop lamp, and a turn lamp. (An eleventh configuration.)

Advantageous Effects of the Invention

According to the present invention, it is possible to provide a light-emitting element driving device that operates based on a control signal from a controller so long as the controller is operating normally but that turns ON a light-emitting element irrespective of the control signal from the controller when the controller is operating abnormally, and to provide a light-emitting device and a vehicle that employ such a light-emitting element driving device.

DESCRIPTION OF EMBODIMENTS

First Embodiment

Figure 1:
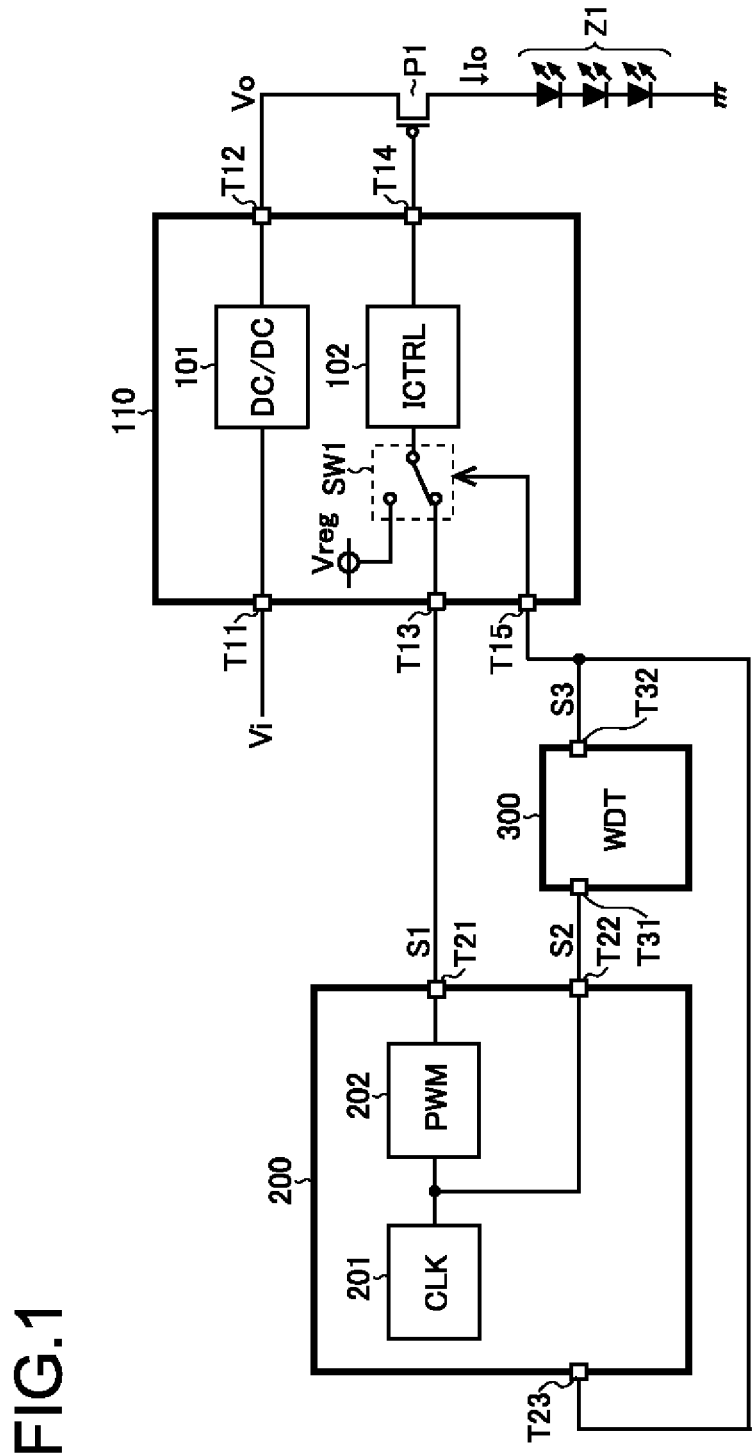
FIG. 1 is a diagram showing a light-emitting device according to a first embodiment.

FIG. 1 is a diagram showing a light-emitting device according to a first embodiment. In FIG. 1, such parts as are found also in FIG. 16 are identified by common reference numerals, and no detailed description will be repeated as to them.

The light-emitting device shown in FIG. 1 includes at least one light-emitting element (in FIG. 1, light-emitting diodes) Z1, a light-emitting element driver IC 110 which drives the light-emitting element Z1, a transistor P1 which is inserted in the power feed path from the light-emitting element driver IC 110 to the light-emitting element Z1, a controller IC 200 which feeds the light-emitting element driver IC 110 with a PWM dimming signal S1, and a monitor IC 300 which checks for a fault in the controller IC 200.

Figure 16:
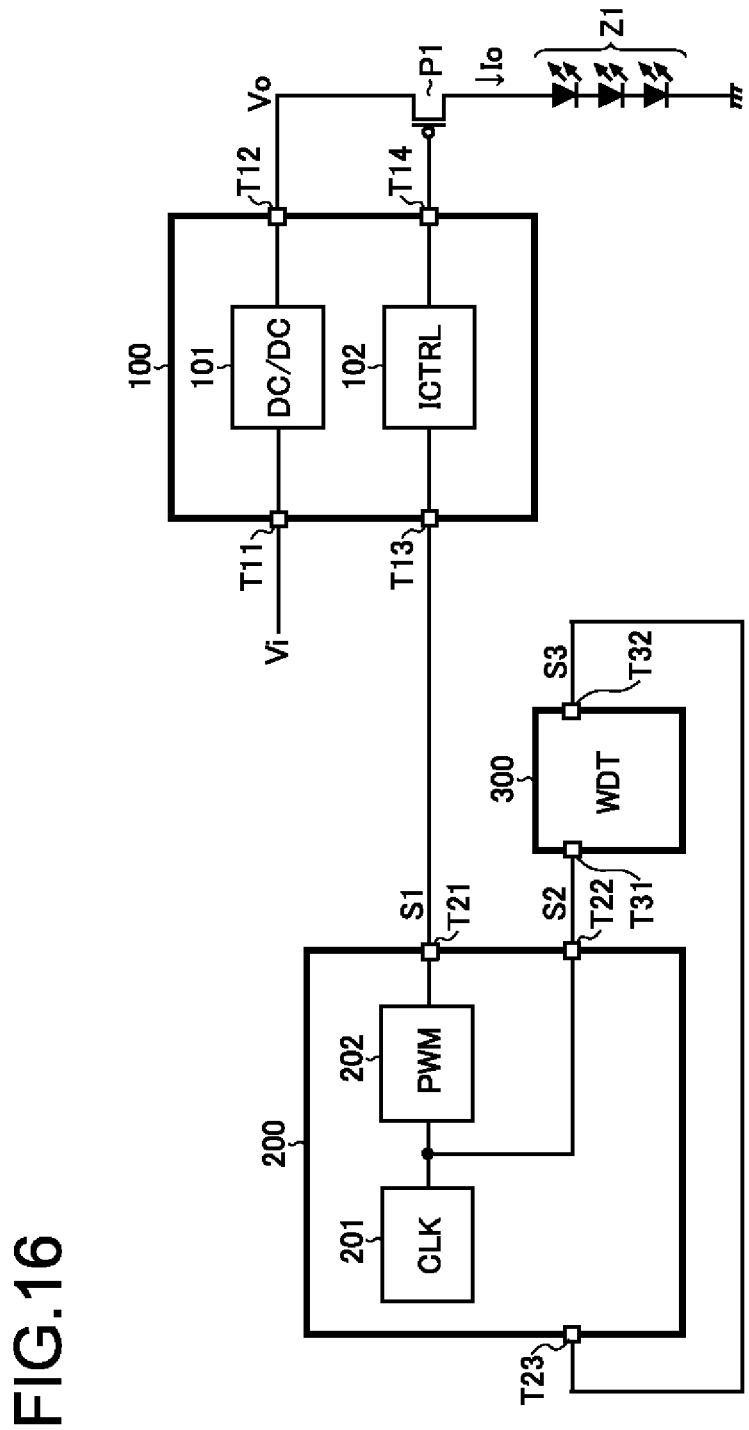
FIG. 16 is a diagram showing an example of a light-emitting device.
Figure 17:
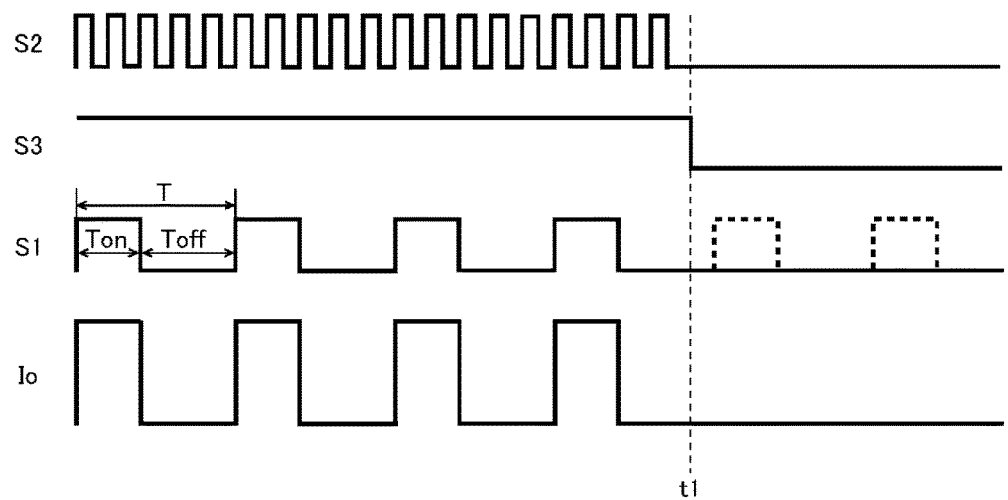
FIG. 17 is a timing chart illustrating an example of the operation of the light-emitting device shown in FIG. 16.

The light-emitting element driver IC 110, as compared with the light-emitting element driver IC 100 shown in FIG. 16, additionally includes a switch SW1 and an external terminal T15. To the external terminal T15, a monitoring result signal S3 is fed. The switch SW1 operates according to the monitoring result signal S3 fed to the external terminal T15. Specifically, when the monitoring result signal S3 is at HIGH level, that is, when no signal indicating a fault in the controller IC 200 is received, the switch SW1 selects the PWM dimming signal S1 fed to the external terminal T13 to feed it to the output current controller 102. On the other hand, when the monitoring result signal S3 is at LOW level, that is, when a signal indicating a fault in the controller IC 200 is received, the switch SW1 selects the terminal to which a constant voltage Vreg (a voltage corresponding to the HIGH level of the PWM dimming signal S1) is applied to feed it to the output current controller 102.

The output current controller 102 keeps the transistor P1 ON when fed with a HIGH-level PWM dimming signal S1 from the switch SW1, keeps the transistor P1 OFF when fed with a LOW-level PWM dimming signal S1 from the switch SW1, and keeps the transistor P1 ON when fed with the constant voltage Vreg from the switch SW1. Thus, the output voltage generator 101, the output current controller 102, the transistor P1, and the switch SW1 serve both as an output voltage feeder which generates the output voltage Vo from the input voltage Vi based on the PWM dimming signal S1 from the controller IC 200 to feed the output voltage Vo to the light-emitting element Z1 and as an emergency driver which, on receiving a signal indicating a fault in the controller IC 200, turns the light-emitting element Z1 ON irrespective of the PWM dimming signal S1 from the controller IC 200.

Figure 2:
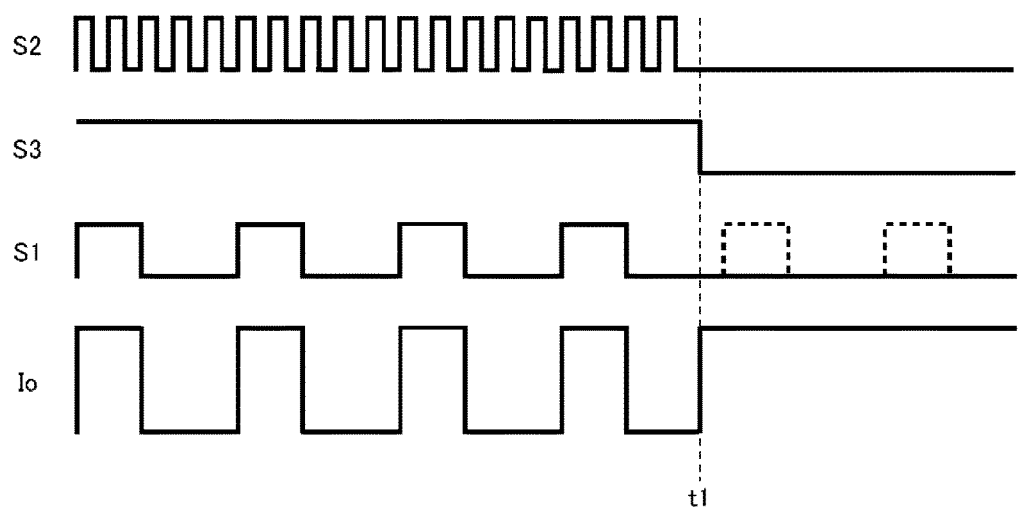
FIG. 2 is a timing chart illustrating an example of the operation of a light-emitting device according to the first or a third embodiment.

FIG. 2 is a timing chart illustrating an example of the operation of the light-emitting device shown in FIG. 1, and depicts, from top down, the clock signal S2, the monitoring result signal S3, the PWM dimming signal S1, and the output current Io.

When a fault in the controller IC 200 causes the clock signal S2 to cease to be generated (after time point t1 in FIG. 2), no pulses appear in the PWM dimming signal S1 any longer (see broken lines in the PWM dimming signal S1 shown in FIG. 2), and the ON duty of the PWM dimming signal S1 becomes zero. However, when a fault in the controller IC 200 causes the clock signal S2 to cease to be generated (after time point t1 in FIG. 2), the monitoring result signal S3 turns to LOW level, and as described above, the switch SW1 selects the constant voltage Vreg. Thus, an output current Io is obtained that is similar to that obtained when the PWM dimming signal S1 with an ON duty of 100% is fed to the output current controller 102. In this way, the light-emitting device shown in FIG. 1 can turn the light-emitting element Z1 ON irrespective of the PWM dimming signal S1 from the controller IC 200 when the controller IC 200 is faulty.

Second Embodiment

Figure 3:
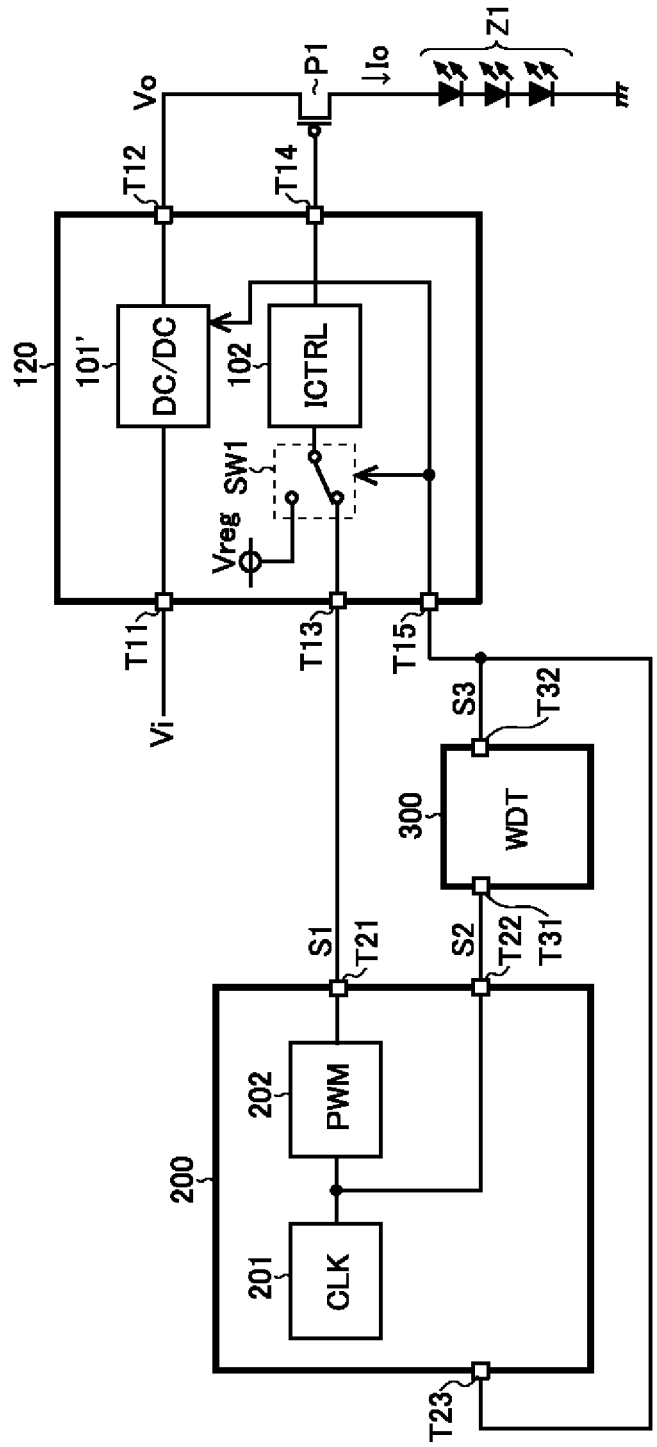
FIG. 3 is a diagram showing a light-emitting device according to a second embodiment.

FIG. 3 is a diagram showing a light-emitting device according to a second embodiment. In FIG. 3, such parts as are found also in FIG. 1 are identified by common reference numerals, and no detailed description will be repeated as to them.

The light-emitting device shown in FIG. 3 includes at least one light-emitting element (in FIG. 3, light-emitting diodes) Z1, a light-emitting element driver IC 120 which drives the light-emitting element Z1, a transistor P1 which is inserted in the power feed path from the light-emitting element driver IC 120 to the light-emitting element Z1, a controller IC 200 which feeds the light-emitting element driver IC 120 with a PWM dimming signal S1, and a monitor IC 300 which checks for a fault in the controller IC 200.

In the light-emitting element driver IC 120, an output voltage generator 101' substitutes for the output voltage generator 101 in the light-emitting element driver IC 110 shown in FIG. 1. The output voltage generator 101' varies the set value of the output voltage Vo according to the monitoring result signal S3 fed to the external terminal T15. Specifically, when the monitoring result signal S3 is at HIGH level, that is, when no signal indicating a fault in the controller IC 200 is received, the output voltage generator 101' keeps the set value of the output voltage Vo at a standard value. On the other hand, when the monitoring result signal S3 is at LOW level, that is, when a signal indicating a fault in the controller IC 200 is received, the output voltage generator 101' keeps the set value of the output voltage Vo at a value smaller than the standard value. Accordingly, also the value of the output current Io is then smaller than when the set value of the output voltage Vo equals the standard value.

Figure 4:
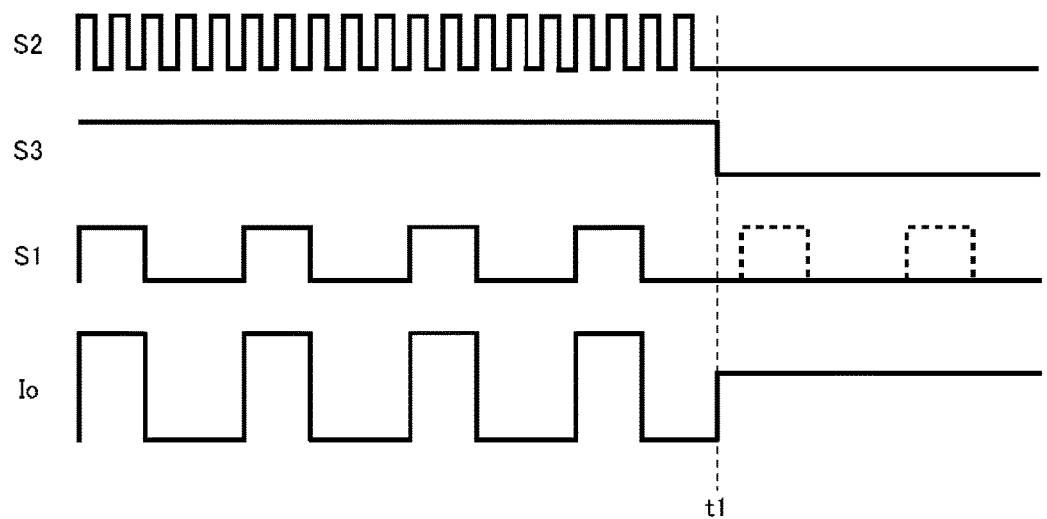
FIG. 4 is a timing chart illustrating an example of the operation of a light-emitting device according to the second or a fourth embodiment.

FIG. 4 is a timing chart illustrating an example of the operation of the light-emitting device shown in FIG. 3, and depicts, from top down, the clock signal S2, the monitoring result signal S3, the PWM dimming signal S1, and the output current Io.

When a fault in the controller IC 200 causes the clock signal S2 to cease to be generated (after time point t1 in FIG. 4), no pulses appear in the PWM dimming signal S1 any longer (see broken lines in the PWM dimming signal S1 shown in FIG. 4), and the ON duty of the PWM dimming signal S1 becomes zero. However, when a fault in the controller IC 200 causes the clock signal S2 to cease to be generated (after time point t1 in FIG. 4), the monitoring result signal S3 turns to LOW level, and as described above, the switch SW1 selects the constant voltage Vreg, and in addition the output voltage generator 101' turns the set value of the output voltage Vo to a value smaller than the standard value. Thus, an output current Io continues to be obtained with a smaller value than when the controller IC 200 is not faulty. In this way, the light-emitting device shown in FIG. 3 can turn the light-emitting element Z1 ON irrespective of the PWM dimming signal S1 from the controller IC 200 when the controller IC 200 is faulty.

Moreover, the light-emitting device shown in FIG. 3 can keep the value of the output current Io smaller when the controller IC 200 is faulty than when the controller IC 200 is not faulty.

When the controller IC 200 is faulty, the electric power source from which the input voltage Vi is derived may be in danger of approaching depletion. However, as described above, the light-emitting device shown in FIG. 3 makes the value of the output current Io smaller when the controller IC 200 is faulty, and this reduces electric power consumption in the light-emitting device shown in FIG. 3 when the controller IC 200 is faulty. In this way, it is possible to make the electric power source from which the input voltage Vi is derived less likely to deplete when the controller IC 200 is faulty.

When the controller IC 200 is faulty, as a result of the output current Io continuing to be fed to the light-emitting element Z1, the light-emitting element Z1 may break depending on its specifications. However, as described above, the light-emitting device shown in FIG. 3 makes the value of the output current Io smaller when the controller IC 200 is faulty, and this prevents the light-emitting element Z1 from breaking.

Third Embodiment

Figure 5:
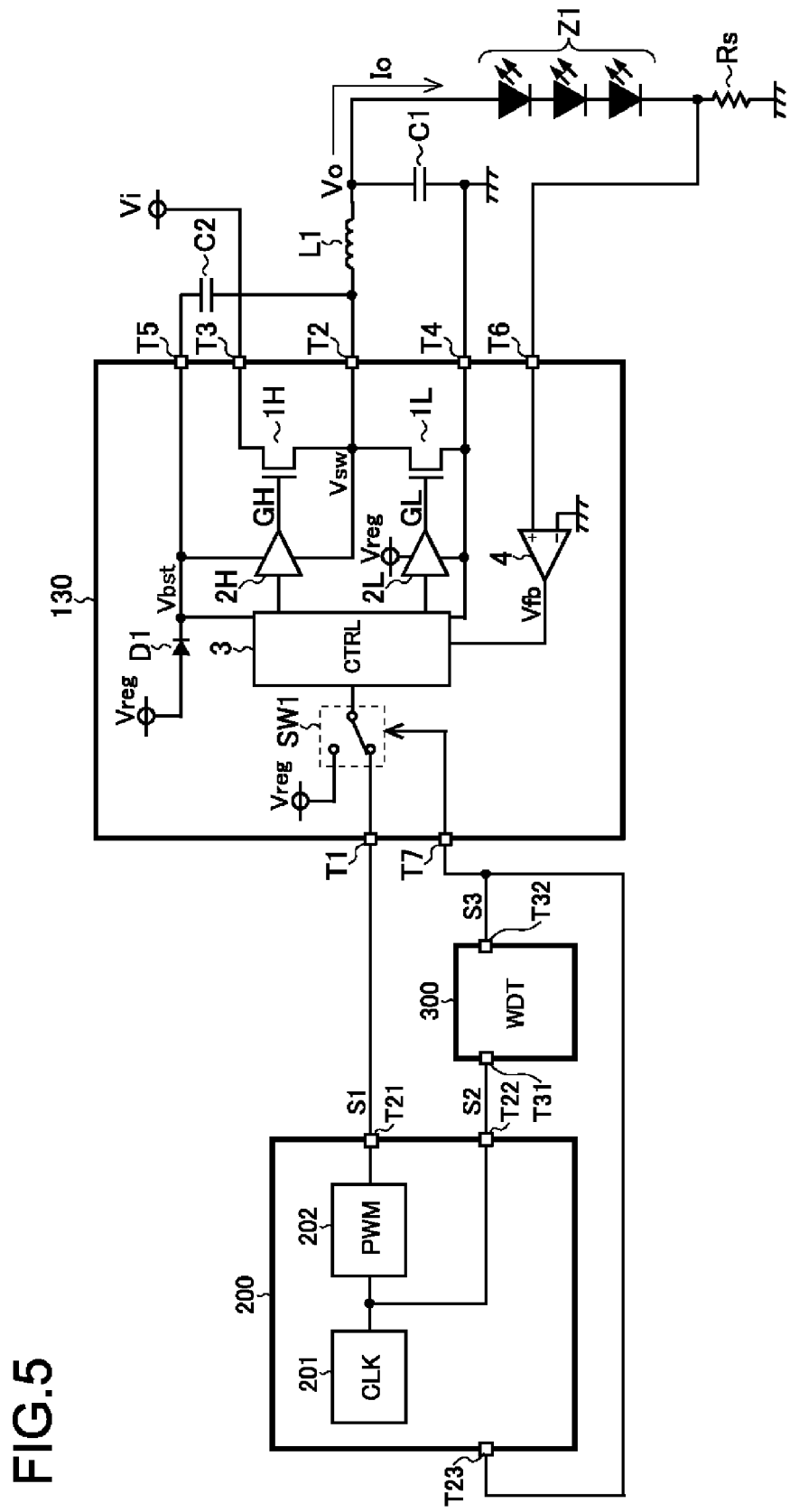
FIG. 5 is a diagram showing a light-emitting device according to the third embodiment.

FIG. 5 is a diagram showing a light-emitting device according to a third embodiment. In FIG. 5, such parts as are found also in FIG. 16 are identified by common reference numerals, and no detailed description will be repeated as to them.

The light-emitting device shown in FIG. 5 includes at least one light-emitting element (in FIG. 5, light-emitting diodes) Z1, a light-emitting element driver IC 130 which drives the light-emitting element Z1, a coil L1, an output capacitor C1, a sense resistor Rs, a capacitor C2, a controller IC 200 which feeds the light-emitting element driver IC 130 with a PWM dimming signal S1, and a monitor IC 300 which checks for a fault in the controller IC 200.

The light-emitting element driver IC 130 is a semiconductor integrated circuit device (a so-called LED driver IC) that has integrated into it N-channel MOS field-effect transistors 1H and 1L (hereinafter referred to as high-side and low-side transistors 1H and 1L respectively), a high-side driver 2H and a low-side driver 2L, a diode D1, a driver controller 3, an amplifier 4, and a switch SW1. The light-emitting element driver IC 130 also has external terminals T1 to T7 for establishing electrical connection with the outside.

Outside the light-emitting element driver IC 130, the external terminal T3 is connected to a terminal to which the input voltage Vi is applied. To the external terminal T1, the PWM dimming signal S1 is fed. The external terminal T2 is connected to the first terminal of the coil L1. The second terminal of the coil L1 (i.e., the terminal to which the output voltage Vo is applied) is connected to the first terminal (anode) of the light-emitting element Z1. The second terminal (cathode) of the light-emitting element Z1 is connected to the first terminal of the sense resistor Rs. The second terminal of the sense resistor Rs is connected to a ground terminal. The first terminal of the output capacitor C1 is connected to the second terminal of the coil L1. The second terminal of the output capacitor C1 is connected to the ground terminal. The external terminal T4 is connected to the ground terminal. The external terminal T5 is connected via the capacitor C2 to the first terminal of the coil L1. The external terminal T6 is connected to the first terminal of the sense resistor Rs. To the external terminal T7, the monitoring result signal S3 is fed.

Inside the light-emitting element driver IC 130, the drain of the high-side transistor 1H is connected to the external terminal T3. The source of the high-side transistor 1H is connected to the external terminal T2. The gate of the high-side transistor 1H is connected to the output terminal of the high-side driver 2H. The drain of the low-side transistor 1L is connected to the external terminal T2. The source of the low-side transistor 1L is connected to the external terminal T4. The gate of the low-side transistor 1L is connected to the output terminal of the low-side driver 2L. Thus, the high-side and low-side transistors 1H and 1L are connected in series between the terminal to which the input voltage Vi is applied and the ground terminal, and the connection node between them (i.e., the terminal to which a switching voltage Vsw is applied) is connected via the coil L1 to the output capacitor C1.

Based on an instruction from the driver controller 3, the high-side driver 2H generates a control signal GH for the high-side transistor 1H. The high-side transistor 1H is ON when the control signal GH is at HIGH level, and is OFF when the control signal GH is at LOW level. Based on an instruction from the driver controller 3, the low-side driver 2L generates a control signal GL for the low-side transistor 1L. The low-side transistor 1L is ON when the control signal GL is at HIGH level, and is OFF when the control signal GL is at LOW level.

The diode D1 and the capacitor C2, which is externally fitted to the light-emitting element driver IC 130, constitute a bootstrap circuit. The bootstrap circuit generates a boost voltage Vbst. The anode of the diode D1 is connected to a terminal to which the constant voltage Vreg is applied. The cathode of the diode D1 is connected to the external terminal T5.

The first power terminal of the high-side driver 2H and the first power terminal of the driver controller 3 are connected to the external terminal T5 (i.e., the terminal to which the boost voltage Vbst is applied). The second power terminal of the high-side driver 2H is connected to the external terminal T2 (i.e., the terminal to which the switching voltage Vsw is applied). Thus, the control signal GH applied to the gate of the high-side transistor 1H, when at HIGH level, equals the boost voltage Vbst and, when at LOW level, equals the switching voltage Vsw.

The first power terminal of the low-side driver 2L is connected to the terminal to which the constant voltage Vreg is applied. The second power terminal of the low-side driver 2L is connected to the external terminal T4 (i.e., the terminal to which a ground voltage GND is applied). Thus, the control signal GL applied to the gate of the low-side transistor 1L, when at HIGH level, equals the constant voltage Vreg and, when at LOW level, equals the ground voltage GND.

The operation of the bootstrap circuit configured as described above will now be described. When the high-side transistor 1H is OFF and the low-side transistor 1L is ON so that the switching voltage Vsw is at LOW level (GND), a current that passes from the constant voltage Vreg application terminal via the diode D1 into the capacitor C2 charges the capacitor C2. At this time, the boost voltage Vbst approximately equals the constant voltage Vreg (more precisely, the constant voltage Vreg minus the forward voltage drop Vf across the diode D1, i.e., Vreg−Vf).

On the other hand, when, with the capacitor C2 charged, the high-side transistor 1H is turned ON and the low-side transistor 1L is turned OFF so that the switching voltage Vsw rises from LOW level (GND) to HIGH level (Vi), the boost voltage Vbst is raised to a value (Vi+Vreg) that is higher than the HIGH level (Vi) of the switching voltage Vsw by the charge voltage (approximately Vreg) across the capacitor C2. Applying this boost voltage Vbst to the first power terminal of the high-side driver 2H makes it possible to turn the high-side transistor 1H ON and OFF reliably.

The switch SW1 operates according to the monitoring result signal S3 fed to the external terminal T7. Specifically, when the monitoring result signal S3 is at HIGH level, that is, when no signal indicating a fault in the controller IC 200 is received, the switch SW1 selects the PWM dimming signal S1 fed to the external terminal T1 to feed it to the driver controller 3. On the other hand, when the monitoring result signal S3 is at LOW level, that is, when a signal indicating a fault in the controller IC 200 is received, the switch SW1 selects the terminal to which the constant voltage Vreg (a voltage corresponding to the HIGH level of the PWM dimming signal S1) is applied to feed it to the driver controller 3.

When fed with a HIGH-level PWM dimmer signal S1 from the switch SW1, the driver controller 3 drives the high-side and low-side drivers 2H and 2L so as to turn the high-side and low-side transistors 1H and 1L ON and OFF according to a feedback voltage Vfb. Also, when fed with the constant voltage Vreg from the switch SW1, the driver controller 3 drives the high-side and low-side drivers 2H and 2L so as to turn the high-side and low-side transistors 1H and 1L ON and OFF according to the feedback voltage Vfb. By contrast, when fed with a LOW-level PWM dimmer signal S1 from the switch SW1, the driver controller 3 drives the high-side and low-side drivers 2H and 2L so as to stop the operation for generating the output voltage Vo.

The amplifier 4 generates the feedback voltage Vfb by amplifying the voltage across the sense resistor Rs that is applied between the non-inverting input terminal (+) and the inverting input terminal (−) of the amplifier 4. Accordingly, the feedback voltage Vfb is a voltage signal that increases and decreases according to the output current Io through the sense resistor Rs.

The high-side and low-side transistors 1H and 1L, the high-side and low-side drivers 2H and 2L, the driver controller 3, and the amplifier 4 thus generate the output voltage Vo from the input voltage Vi such that the output current Io through the light-emitting element Z1 remains equal to the target value during the ON period (HIGH-level period) of the PWM dimming signal S1, and stop the operation for generating the output voltage Vo during the OFF period of the PWM dimming signal S1.

The light-emitting element driver IC 130, the coil L1, the output capacitor C1, the sense resistor Rs, and the capacitor C2 serve both as an output voltage feeder which generates the output voltage Vo from the input voltage Vi based on the PWM dimming signal S1 from the controller IC 200 to feed the output voltage Vo to the light-emitting element Z1 and as an emergency driver which, on receiving a signal indicating a fault in the controller IC 200, turns the light-emitting element Z1 ON irrespective of the PWM dimming signal S1 from the controller IC 200.

The timing chart (FIG. 2) illustrating an example of the operation of the light-emitting device shown in FIG. 1 illustrates an example of the operation of the light-emitting device shown in FIG. 5 as well, and therefore no overlapping description will be repeated.

Fourth Embodiment

Figure 6:
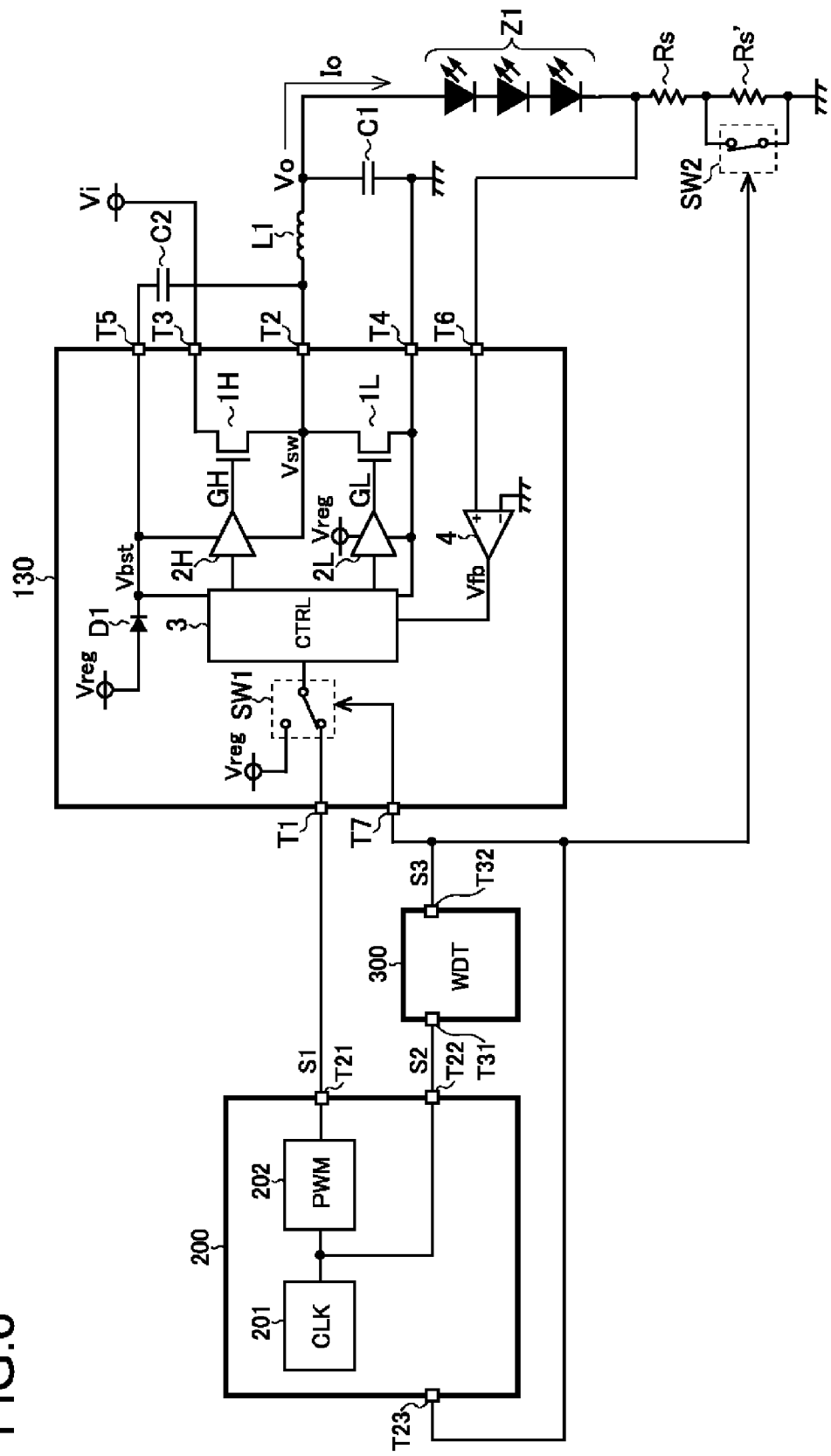
FIG. 6 is a diagram showing a light-emitting device according to the fourth embodiment.

FIG. 6 is a diagram showing a light-emitting device according to a fourth embodiment. In FIG. 6, such parts as are found also in FIG. 5 are identified by common reference numerals, and no detailed description will be repeated as to them.

The light-emitting device shown in FIG. 6 includes at least one light-emitting element (in FIG. 6, light-emitting diodes) Z1, a light-emitting element driver IC 130 which drives the light-emitting element Z1, a coil L1, an output capacitor C1, sense resistors Rs and Rs', a switch SW2, a capacitor C2, a controller IC 200 which feeds the light-emitting element driver IC 130 with a PWM dimming signal S1, and a monitor IC 300 which checks for a fault in the controller IC 200.

The sense resistor Rs' is inserted between the ground terminal and the second terminal of the sense resistor Rs, and the switch SW2 is connected in parallel with the sense resistor Rs'. The switch SW2 operates according to the monitoring result signal S3. Specifically, when the monitoring result signal S3 is at HIGH level, that is, when the switch SW2 receives no signal indicating a fault in the controller IC 200, the switch SW2 is ON so as to short-circuit across the sense resistor Rs'. On the other hand, when the monitoring result signal S3 is at LOW level, that is, when the switch SW2 receives a signal indicating a fault in the controller IC 200, the switch SW2 is OFF so as not to short-circuit across the sense resistor Rs'. Thus, when the switch SW2 receives a signal indicating a fault in the controller IC 200, the gain of the feedback voltage Vfb with respect to the output current Io is higher and hence the value of the output current Io is smaller than when the switch SW2 receives no signal indicating a fault in the controller IC 200.

The timing chart (FIG. 4) illustrating an example of the operation of the light-emitting device shown in FIG. 3 illustrates an example of the operation of the light-emitting device shown in FIG. 6 as well, and therefore no overlapping description will be repeated.

Fifth Embodiment

Figure 7:
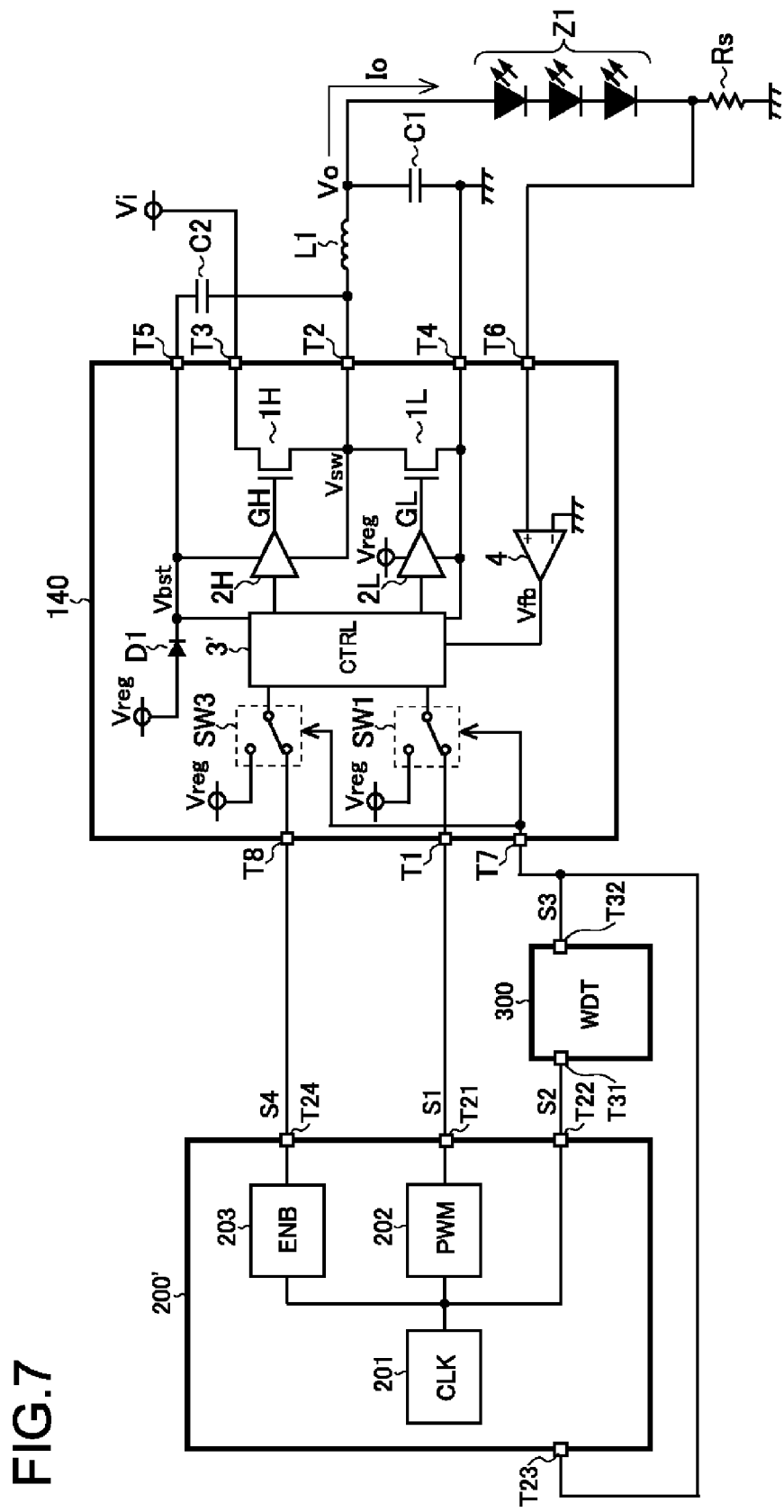
FIG. 7 is a diagram showing a light-emitting device according to a fifth embodiment.

FIG. 7 is a diagram showing a light-emitting device according to a fifth embodiment. In FIG. 7, such parts as are found also in FIG. 5 are identified by common reference numerals, and no detailed description will be repeated as to them.

The light-emitting device shown in FIG. 7 includes at least one light-emitting element (in FIG. 7, light-emitting diodes) Z1, a light-emitting element driver IC 140 which drives the light-emitting element Z1, a coil L1, an output capacitor C1, a sense resistor Rs, a capacitor C2, a controller IC 200' which feeds the light-emitting element driver IC 140 with a PWM dimming signal S1, and a monitor IC 300 which checks for a fault in the controller IC 200'.

The controller IC 200' additionally includes an enable circuit 203 and an external terminal T24 as compared with the controller IC 200 shown in FIG. 5. The enable circuit 203 generates an enable signal S4 based on the clock signal S2. From the external terminal T24, the enable signal S4 is output. In this example, the enable signal S4 is used to enable the light-emitting element driver IC 140. A HIGH-level enable signal S4 serves as a signal that enables the light-emitting element driver IC 140, and a LOW-level enable signal S4 serves as a signal (disable signal) that disables the light-emitting element driver IC 140.

In the light-emitting element driver IC 140, a driver controller 3' substitutes for the driver controller 3 in the light-emitting element driver IC 130 shown in FIG. 5, and a switch SW3 and an external terminal T8 are additionally provided. To the external terminal T8, the enable signal S4 is fed. The switch SW3 operates according to the monitoring result signal S3 fed to the external terminal T7. Specifically, when the monitoring result signal S3 is at HIGH level, that is, when no signal indicating a fault in the controller IC 200' is received, the switch SW3 selects the enable signal S4 fed to the external terminal T8 to feed it to the driver controller 3'. On the other hand, when the monitoring result signal S3 is at LOW level, that is, when a signal indicating a fault in the controller IC 200' is received, the switch SW3 selects the terminal to which the constant voltage Vreg (a voltage corresponding to the HIGH level of the enable signal S4) is applied to feed it to the driver controller 3'.

The switch SW1 operates according to the monitoring result signal S3 fed to the external terminal T7. Specifically, when the monitoring result signal S3 is at HIGH level, that is, when no signal indicating a fault in the controller IC 200' is received, the switch SW1 selects the PWM dimming signal S1 fed to the external terminal T1 to feed it to the driver controller 3'. On the other hand, when the monitoring result signal S3 is at LOW level, that is, when a signal indicating a fault in the controller IC 200' is received, the switch SW1 selects the terminal to which the constant voltage Vreg (a voltage corresponding to the HIGH level of the PWM dimming signal S1) is applied to feed it to the driver controller 3'.

The driver controller 3' is enabled when fed with a HIGH-level enable signal S4 or the constant voltage Vreg from the switch SW2, and is disabled when fed with a LOW-level enable signal S4 from the switch SW2.

When enabled and fed with a HIGH-level PWM dimmer signal S1 from the switch SW1, the driver controller 3' drives the high-side and low-side drivers 2H and 2L so as to turn the high-side and low-side transistors 1H and 1L ON and OFF according to the feedback voltage Vfb. Also, when enabled and fed with the constant voltage Vreg from the switch SW1, the driver controller 3' drives the high-side and low-side drivers 2H and 2L so as to turn the high-side and low-side transistors 1H and 1L ON and OFF according to the feedback voltage Vfb. By contrast, when enabled and fed with a LOW-level PWM dimmer signal S1 from the switch SW1, the driver controller 3' drives the high-side and low-side drivers 2H and 2L so as to stop the operation for generating the output voltage Vo.

The light-emitting element driver IC 140, the coil L1, the output capacitor C1, the sense resistor Rs, and the capacitor C2 serve both as an output voltage feeder which generates the output voltage Vo from the input voltage Vi based on the PWM dimming signal S1 and the enable signal S4 from the controller IC 200' to feed the output voltage Vo to the light-emitting element Z1 and as an emergency driver which, on receiving a signal indicating a fault in the controller IC 200', turns the light-emitting element Z1 ON irrespective of the PWM dimming signal S1 and the enable signal S4 from the controller IC 200'.

Figure 8:
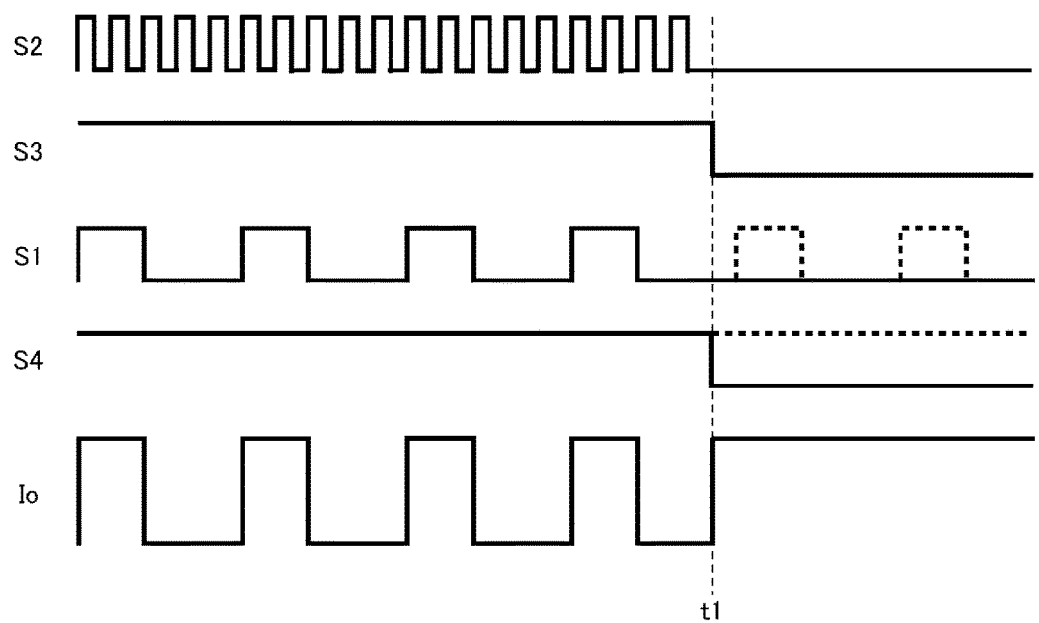
FIG. 8 is a timing chart illustrating an example of the operation of a light-emitting device according to the fifth embodiment.

FIG. 8 is a timing chart illustrating an example of the operation of the light-emitting device shown in FIG. 7, and depicts, from top down, the clock signal S2, the monitoring result signal S3, the PWM dimming signal S1, the enable signal S4, and the output current Io.

When a fault in the controller IC 200' causes the clock signal S2 to cease to be generated (after time point t1 in FIG. 8), no pulses appear in the PWM dimming signal S1 any longer (see broken lines in the PWM dimming signal S1 shown in FIG. 8), with the result that the ON duty of the PWM dimming signal S1 becomes zero and the enable signal S4 falls to LOW level (see broken lines in the enable signal S4 shown in FIG. 8). However, when a fault in the controller IC 200' causes the clock signal S2 to cease to be generated (after time point t1 in FIG. 8), the monitoring result signal S3 turns to LOW level, and as described above, the switches SW1 and SW3 both select the constant voltage Vreg. Thus, an output current Io is obtained that is similar to that obtained when the PWM dimming signal S1 with an ON duty of 100% is fed along with a HIGH-level enable signal S4 to the driver controller 3'. In this way, the light-emitting device shown in FIG. 7 can turn the light-emitting element Z1 ON irrespective of the PWM dimming signal S1 and the enable signal S4 from the controller IC 200' when the controller IC 200' is faulty.

Sixth Embodiment

Figure 9:
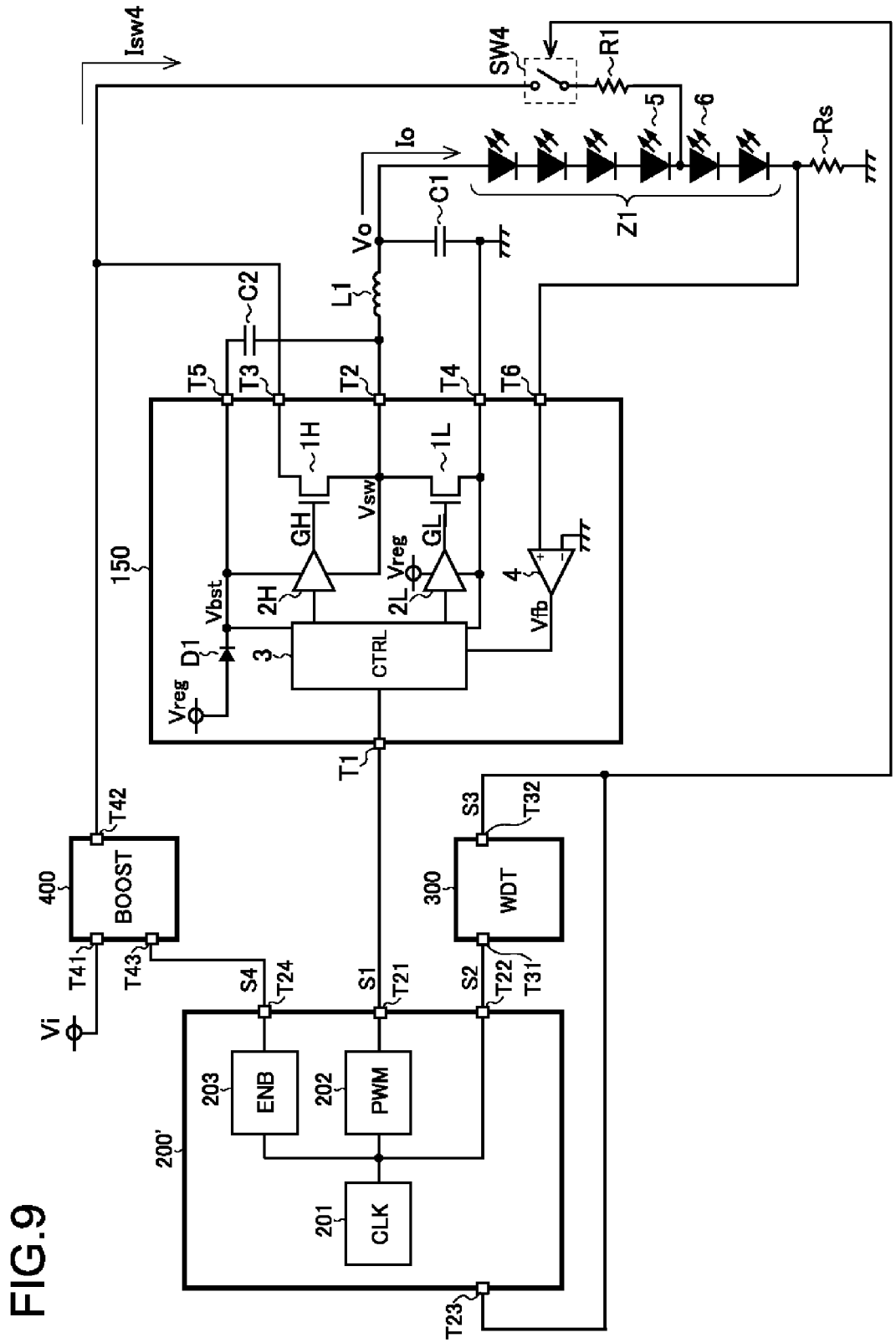
FIG. 9 is a diagram showing a light-emitting device according to a sixth embodiment.

FIG. 9 is a diagram showing a light-emitting device according to a sixth embodiment. In FIG. 9, such parts as are found also in FIG. 7 are identified by common reference numerals, and no detailed description will be repeated as to them.

The light-emitting device shown in FIG. 9 includes a plurality of light-emitting elements (in FIG. 9, light-emitting diodes) Z1, a light-emitting element driver IC 150 which drives the light-emitting elements Z1, a coil L1, an output capacitor C1, a sense resistor Rs, a capacitor C2, a controller IC 200' which feeds the light-emitting element driver IC 150 with a PWM dimming signal S1 and feeds a voltage booster IC 400 with an enable signal S4, a monitor IC 300 which checks for a fault in the controller IC 200', and a voltage booster IC 400 which boosts the input voltage Vi to feed the boosted voltage to the light-emitting element driver IC 150. In a case where the total forward voltage of a plurality of light-emitting elements Z1 is higher than the input voltage Vi, a voltage boosting circuit (voltage booster IC 400) is provided to boost the input voltage Vi as in this example. For example, in a case where the output voltage of a battery mounted on a vehicle is used as the input voltage Vi, the input voltage Vi can be so low that the total forward voltage of a plurality of light-emitting elements Z1 tends to be higher than the input voltage Vi.

In the light-emitting element driver IC 150, as compared with the light-emitting element driver IC 140 shown in FIG. 7, the switches SW1 and SW3 and the external terminals T7 and T8 are omitted.

In this example, the enable signal S4 is used to enable the voltage booster IC 400. A HIGH-level enable signal S4 serves as a signal that enables the voltage booster IC 400, and a LOW-level enable signal S4 serves as a signal (disable signal) that disables the voltage booster IC 400.

The voltage booster IC 400 has external terminals T41 to T43. To the external terminal T41, the input voltage Vi is applied. When the voltage booster IC 400 is enabled, a voltage that results from boosting the input voltage Vi is output from the external terminal T42 to be fed to the external terminal T3 of the light-emitting element driver IC 150 and to the first terminal of a switch SW4. The second terminal of the switch SW4 is connected via a resistor R1 to the connection node between the cathode of a first light-emitting element 5 among the plurality of light-emitting elements Z1 and the anode of a second light-emitting element 6 among the plurality of light-emitting elements Z1. The switch SW4 operates according to the monitoring result signal S3. Specifically, when the monitoring result signal S3 is at HIGH level, that is, when the switch SW4 receives no signal indicating a fault in the controller IC 200', the switch SW4 is OFF. On the other hand, when the monitoring result signal S3 is at LOW level, that is, when the switch SW4 receives a signal indicating a fault in the controller IC 200', the switch SW4 is ON, so that part of the plurality of light-emitting elements Z1 (the second light-emitting element 6 and those light-emitting elements which are provided on the cathode side of the second light-emitting element 6) turn ON. The current Isw4 through the switch SW4 is limited by the resistor R1. In this way, it is possible to prevent part of the plurality of light-emitting elements Z1 (the second light-emitting element 6 and those light-emitting elements which are provided on the cathode side of the second light-emitting element 6) from being broken by the current Isw4.

The voltage booster IC 400, the light-emitting element driver IC 150, the coil L1, the output capacitor C1, the sense resistor Rs, and the capacitor C2 serve as an output voltage feeder which generates the output voltage Vo from the input voltage Vi based on the PWM dimming signal S1 from the controller IC 200' to feed the output voltage Vo to the light-emitting elements Z1. On the other hand, the voltage booster IC 400, the switch SW4, and the resistor R1 serve as an emergency driver which, on receiving a signal indicating a fault in the controller IC 200', turns part of the plurality of light-emitting elements Z1 ON irrespective of the PWM dimming signal S1 from the controller IC 200'. Thus, the output voltage feeder and the emergency driver share the voltage booster IC 400 between them.

Figure 10:
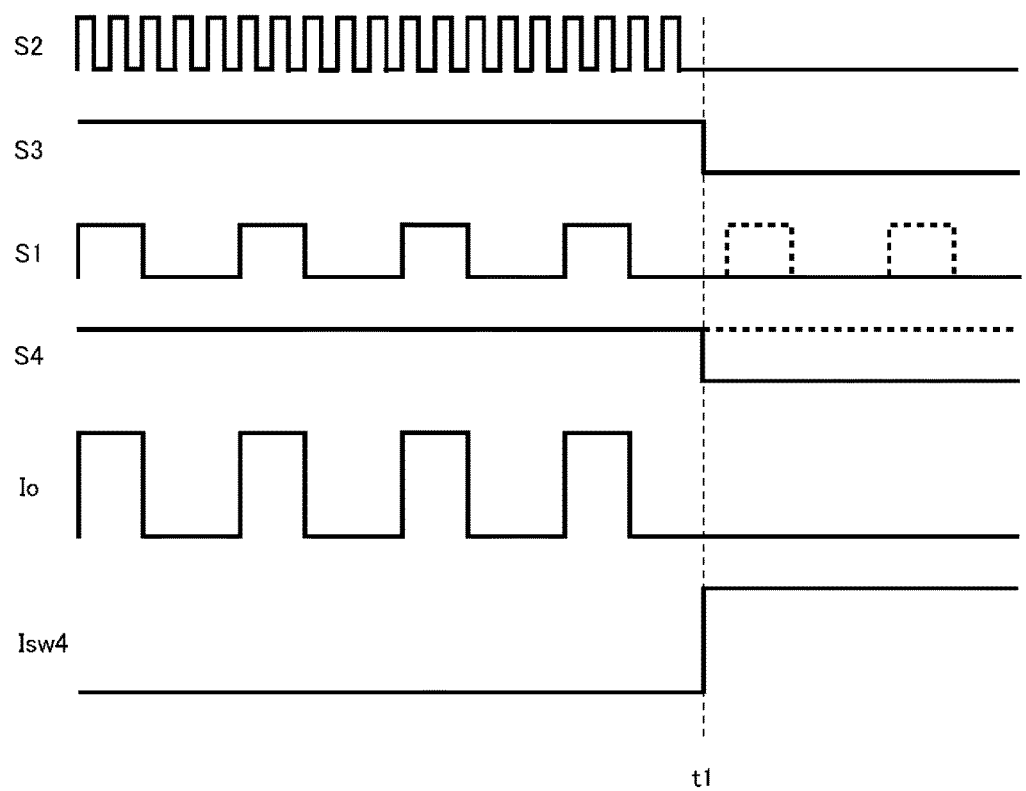
FIG. 10 is a timing chart illustrating an example of the operation of a light-emitting device according to the sixth embodiment.

FIG. 10 is a timing chart illustrating an example of the operation of the light-emitting device shown in FIG. 9, and depicts, from top down, the clock signal S2, the monitoring result signal S3, the PWM dimming signal S1, the enable signal S4, the output current Io, and the current Isw4 through the switch SW4.

When a fault in the controller IC 200' causes the clock signal S2 to cease to be generated (after time point t1 in FIG. 10), no pulses appear in the PWM dimming signal S1 any longer (see broken lines in the PWM dimming signal S1 shown in FIG. 10), with the result that the ON duty of the PWM dimming signal S1 becomes zero and the enable signal S4 falls to LOW level (see broken lines in the enable signal S4 shown in FIG. 10). However, when a fault in the controller IC 200' causes the clock signal S2 to cease to be generated (after time point t1 in FIG. 10), the monitoring result signal S3 turns to LOW level, and as described above, the switch SW4 turns ON; thus, a current Isw4 passes through part of the light-emitting elements Z1 so that this part of the light-emitting elements Z1 turn ON. In this way, the light-emitting device shown in FIG. 9 can turn some of the light-emitting elements Z1 ON irrespective of the PWM dimming signal S1 and the enable signal S4 from the controller IC 200' when the controller IC 200' is faulty.

<Application>

Figure 11:
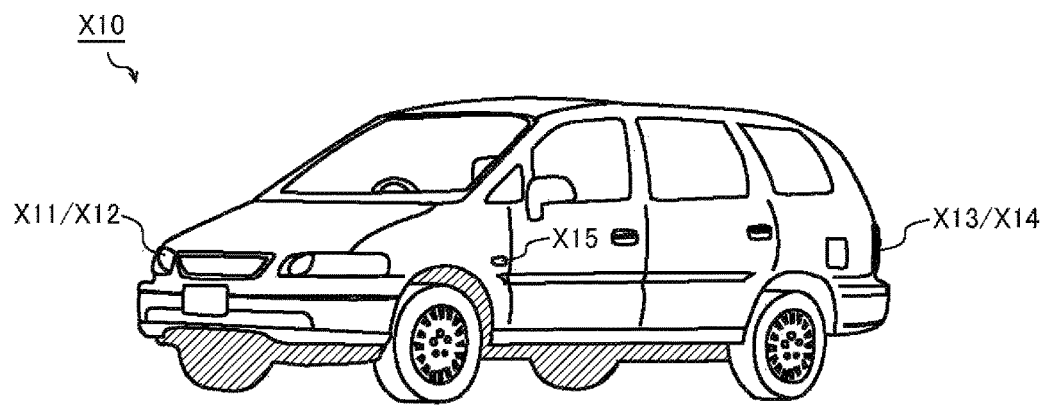
FIG. 11 is an exterior view (front side) of a vehicle having light-emitting devices mounted on it.
Figure 12:
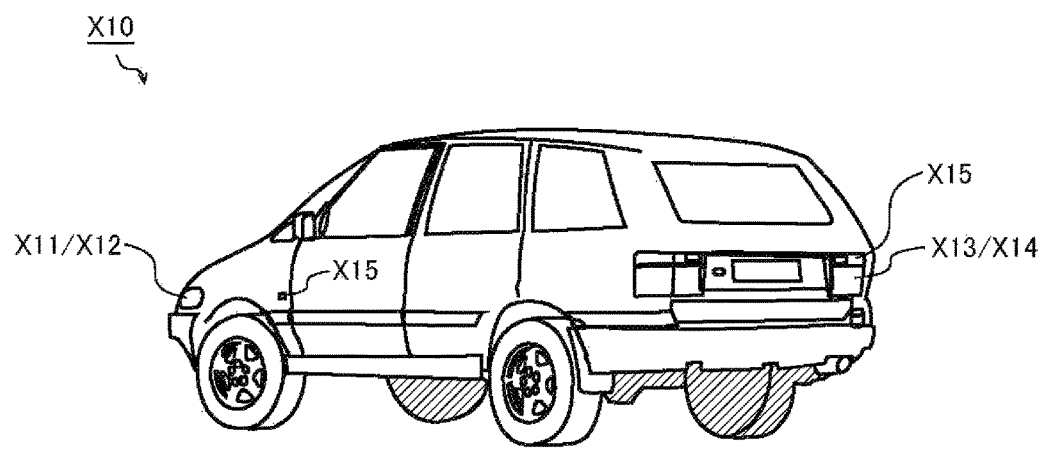
FIG. 12 is an exterior view (rear side) of a vehicle having light-emitting devices mounted on it.

The light-emitting devices according to the embodiments described above can be suitably used as various lights on vehicles as shown in FIGS. 11 and 12, such as head lights (including high-beam lamps, low-beam lamps, small lamps, fog lamps, and the like as necessary) X11, light sources for daytime running lights (DRLs) X12, tail lamps (including small lamps, back lamps, and the like as necessary) X13, stop lamps X14, and turn lamps X15.

Figure 13:
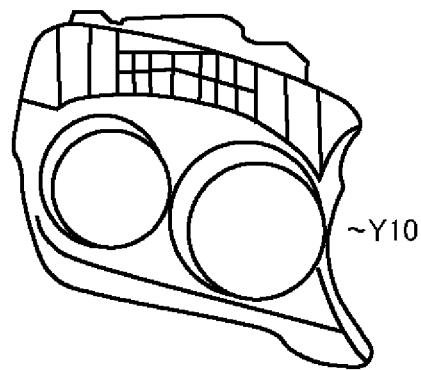
FIG. 13 is an exterior view of an LED head light module.
Figure 14:
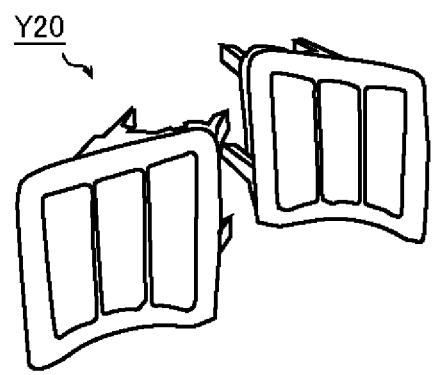
FIG. 14 is an exterior view of an LED turn lamp module.
Figure 15:
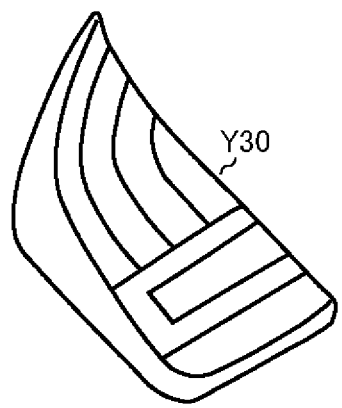
FIG. 15 is an exterior view of an LED rear lamp module.

A light-emitting element driver IC may be provided as a module (like an LED head light module Y10 as shown in FIG. 13, an LED turn lamp module Y20 as shown in FIG. 14, or an LED rear lamp module Y30 as shown in FIG. 15) in which it is incorporated along with externally fitted components (such as an output capacitor C1, a capacitor C2, a coil L1, a sense resistor Rs, etc.) and a light-emitting element Z1 as the driving target, or may be provided as an IC by itself (like the light-emitting element driver ICs 110 to 150) that is a half-finished product independent of externally fitted components (such as an output capacitor C1, a capacitor C2, coil L1, a sense resistor Rs, etc.) and a light-emitting element Z1 as the driving target.

<Other Modifications>

Although the embodiments described above deal with configurations where light-emitting diodes are used as light-emitting elements, this is not meant to limit how the invention should be implemented. Instead, for example, organic electroluminescence elements may be used as light-emitting elements.

The various technical features disclosed herein may be implemented in any other manners than as in the embodiments described above, and allow for any modifications within the spirit of the technical ingenuity involved. For example, bipolar transistors and MOS field-effect transistors can be substituted for each other as necessary, and the logic levels of various signals can be inverted as necessary. For another example, the fifth and sixth embodiments can be modified to omit the dimming function. That is, the embodiments described above should be considered to be in every aspect illustrative and not restrictive, and it should be understood that the technical scope of the present invention is defined not by the description of embodiments given above but by the appended claims and encompasses any modifications made in the sense and scope equivalent to those of the claims.

LIST OF REFERENCE SIGNS

1H N-channel MOS field-effect transistor (high-side transistor)
1L N-channel MOS field-effect transistor (low-side transistor)
2H high-side driver
2L low-side driver
3 controller
4 amplifier
5 first light-emitting element
6 second light-emitting element
110, 120, 130, 140, 150 light-emitting element driver IC
101 output voltage generator
102 output current controller
200, 200' controller IC
201 clock circuit
202 PWM circuit
203 enable circuit
300 monitor IC
400 voltage booster IC
C1 output capacitor
C2 capacitor
D1 diode
L1 coil
P1 P-channel MOS field-effect transistor
R1 resistor
Rs, Rs' sense resistor
SW1-SW4 switch
T1-T8, T11-T15 external terminal
T21-T24, T31, T32, T41-T43 external terminal
X10 vehicle
X11 head light
X12 light source for daytime running light (DRL)
X13 tail lamp
X14 stop lamp
X15 turn lamp
Y10 LED head light module
Y20 LED turn lamp module
Y30 LED rear lamp module
Z1 light-emitting element (light-emitting diode)

The invention claimed is:

1. A light-emitting element driving device comprising:
an output voltage feeder configured to generate an output voltage from an input voltage based on a control signal from a controller to feed the output voltage to at least one light-emitting element; and
an emergency driver configured to turn ON all or part of the at least one light-emitting element irrespective of the control signal from the controller on receiving a signal indicating a fault in the controller,
wherein the output voltage feeder and the emergency driver share between them:
a high-side transistor and a low-side transistor connected between a terminal to which the input voltage is applied and a ground terminal, a connection node between the high-side and low-side transistors being connected via a coil to an output capacitor,
a high-side driver and a low-side driver configured to generate drive control signals for the high-side and low-side transistors respectively,
an amplifier configured to generate a feedback voltage commensurate with a current through the at least one light-emitting element, and
a driver controller configured to drive the high-side and low-side drivers so as to turn the high-side and low-side transistors ON and OFF according to the feedback voltage, and
wherein the high-side and low-side transistors, the high-side and low-side drivers, the amplifier, and the driver controller are all integrated in a single semiconductor device.

2. The light-emitting element driving device of claim 1, wherein
a value of a current that the emergency driver outputs to all or the part of the at least one light-emitting element is smaller than a value of a current that the output voltage feeder outputs to the at least one light-emitting element.

3. The light-emitting element driving device of claim 1, wherein the emergency driver includes a selector configured
to select and output the control signal when no signal indicating a fault in the controller is received, and
to select and output a constant voltage when a signal indicating a fault in the controller is received, and
wherein the driver controller is configured to switch whether or not to drive the high-side and low-side drivers according to an output of the selector.

4. The light-emitting element driving device of claim 3, wherein the selector is integrated in the single semiconductor device.

5. A light-emitting device comprising:
a light-emitting element driving device of claim 1;
at least one light-emitting element configured to be driven by the light-emitting element driving device;
a controller configured to feed a control signal to the light-emitting element driving device; and
a monitor configured to monitor the controller to transmit, on detecting a fault in the controller, a signal indicating the fault in the controller to the light-emitting element driving device.

6. The light-emitting device of claim 5, wherein the light-emitting element is a light-emitting diode or an organic EL element.

7. The light-emitting device of claim 6, wherein the light-emitting device is used as a vehicle-mounted lamp.

8. The light-emitting device of claim 7, wherein the light-emitting device is mounted as a head light module, a turn lamp module, or a rear lamp module on a vehicle.

9. A vehicle comprising the light-emitting device of claim 7.

10. The vehicle of claim 9, wherein the light-emitting device is configured as one of a head light, a light source for a daytime running light, a tail lamp, a stop lamp, and a turn lamp.

11. A light-emitting element driving device comprising:
a high-side transistor and a low-side transistor connected between a terminal to which an input voltage is applied and a ground terminal, a connection node between the high-side and low-side transistors being connected via a coil to an output capacitor,
a high-side driver and a low-side driver configured to generate drive control signals for the high-side and low-side transistors respectively,
an amplifier configured to generate a feedback voltage commensurate with a current through at least one light-emitting element, and
a driver controller configured to drive the high-side and low-side drivers so as to turn the high-side and low-side transistors ON and OFF according to the feedback voltage,
the high-side and low-side transistors, the high-side and low-side drivers, the amplifier, and the driver controller are all integrated in a single semiconductor device,
wherein the driver controller is configured to generate an output voltage from an input voltage based on the control signal from a controller to feed the output voltage to the at least one light-emitting element, and is configured to turn ON all or part of the at least one light-emitting element irrespective of the control signal from the controller on receiving a signal indicating a fault in the controller.

12. The light-emitting element driving device of claim 11, wherein the driver controller includes a selector configured
to select and output the control signal when no signal indicating a fault in the controller is received, and
to select and output a constant voltage when a signal indicating a fault in the controller is received, and
wherein the driver controller is configured to switch whether or not to drive the high-side and low-side drivers according to an output of the selector.

* * * * *